United States Patent
Mani et al.

(10) Patent No.: US 7,947,561 B2
(45) Date of Patent: May 24, 2011

(54) METHODS FOR OXIDATION OF A SEMICONDUCTOR DEVICE

(75) Inventors: Rajesh Mani, San Jose, CA (US); Norman Tam, San Jose, CA (US); Timothy W. Weidman, Sunnyvale, CA (US); Yoshitaka Yokota, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 119 days.

(21) Appl. No.: 12/401,895

(22) Filed: Mar. 11, 2009

(65) Prior Publication Data

US 2009/0233453 A1  Sep. 17, 2009

Related U.S. Application Data

(60) Provisional application No. 61/036,595, filed on Mar. 14, 2008.

(51) Int. Cl.
*H01L 21/00* (2006.01)
(52) U.S. Cl. ......... 438/362; 438/439; 438/225; 257/509
(58) Field of Classification Search .................. 438/438, 438/362, 225; 257/509
See application file for complete search history.

(56) References Cited

U.S. PATENT DOCUMENTS

| | | | | |
|---|---|---|---|---|
| 5,260,600 | A * | 11/1993 | Harada | 257/639 |
| 6,159,835 | A * | 12/2000 | Visokay et al. | 438/592 |
| 6,534,421 | B2 | 3/2003 | Kakkad | |
| 6,803,275 | B1 * | 10/2004 | Park et al. | 438/257 |
| 6,929,700 | B2 | 8/2005 | Tan et al. | |
| 6,958,112 | B2 | 10/2005 | Karim et al. | |
| 7,029,999 | B2 * | 4/2006 | Lim et al. | 438/585 |
| 7,030,475 | B2 * | 4/2006 | Kim | 257/678 |
| 7,122,477 | B2 | 10/2006 | Ikeda | |

(Continued)

FOREIGN PATENT DOCUMENTS

JP  5343391  12/1993

(Continued)

OTHER PUBLICATIONS

Lim, Kwan-Yong, et al., "Highly Reliable and Scalable Tungsten Polymetal Gate Process for Memory Devices using Low-Temperature Plasma Selective Gate Reoxidation," 2006 Symposium on VLSI Technology Digest of Technical Papers, Jun. 2006.

(Continued)

*Primary Examiner* — Jarrett J Stark
*Assistant Examiner* — Nicholas Tobergte
(74) *Attorney, Agent, or Firm* — Moser IP Law Group

(57) ABSTRACT

Methods of fabricating an oxide layer on a semiconductor substrate are provided herein. The oxide layer may be formed over an entire structure disposed on the substrate, or selectively formed on a non-metal containing layer with little or no oxidation of an exposed metal-containing layer. The methods disclosed herein may be performed in a variety of process chambers, including but not limited to decoupled plasma oxidation chambers, rapid and/or remote plasma oxidation chambers, and/or plasma immersion ion implantation chambers. In some embodiments, a method may include providing a substrate comprising a metal-containing layer and non-metal containing layer; and forming an oxide layer on an exposed surface of the non-metal containing layer by exposing the substrate to a plasma formed from a process gas comprising a hydrogen-containing gas, an oxygen-containing gas, and at least one of a supplemental oxygen-containing gas or a nitrogen-containing gas.

18 Claims, 6 Drawing Sheets

U.S. PATENT DOCUMENTS

| | | |
|---|---|---|
| 7,141,514 B2 | 11/2006 | Chua |
| 7,189,652 B1 | 3/2007 | Blosse et al. |
| 7,214,628 B2 | 5/2007 | Chua |
| 7,229,931 B2 | 6/2007 | Mungekar et al. |
| 7,407,871 B2* | 8/2008 | Kumar et al. ............... 438/471 |
| 7,534,709 B2* | 5/2009 | Park et al. ................ 438/592 |
| 2004/0077142 A1* | 4/2004 | Chao et al. ................ 438/253 |
| 2005/0019992 A1* | 1/2005 | Hong et al. ................ 438/149 |
| 2005/0095783 A1 | 5/2005 | Haselden et al. |
| 2005/0101147 A1 | 5/2005 | Labelle et al. |
| 2006/0051921 A1 | 3/2006 | Youn et al. |
| 2006/0105114 A1 | 5/2006 | White |
| 2006/0172551 A1 | 8/2006 | Chua |
| 2006/0223315 A1 | 10/2006 | Yokota et al. |
| 2007/0128880 A1 | 6/2007 | Kitagawa et al. |
| 2007/0224836 A1 | 9/2007 | Sasaki et al. |
| 2007/0298568 A1 | 12/2007 | Mokhlesi |
| 2008/0138994 A1* | 6/2008 | Ueda et al. ................ 438/714 |
| 2009/0035952 A1 | 2/2009 | Chua et al. |
| 2009/0047778 A1* | 2/2009 | Sasaki ................ 438/594 |
| 2009/0169768 A1* | 7/2009 | Ueda et al. ................ 427/569 |

FOREIGN PATENT DOCUMENTS

| | | |
|---|---|---|
| WO | 2006016642 A1 | 2/2006 |

OTHER PUBLICATIONS

International Search Report and Written Opinion mailed Jul. 31, 2009 for PCT Application No. PCT/US2009/036808.

* cited by examiner

METHODS FOR OXIDATION OF A SEMICONDUCTOR DEVICE

CROSS REFERENCE TO RELATED APPLICATIONS

This application claims the benefit of U.S. Provisional Patent Application Ser. No. 61/036,595, filed Mar. 14, 2008, which is herein incorporated by reference.

FIELD

Embodiments of the present invention generally relate to semiconductor fabrication, and more particularly, to oxidation of a semiconductor device or its components.

BACKGROUND

Semiconductor devices often require thin oxide layers to be formed at various stages of their fabrication. For example, in transistors, a thin gate oxide layer may be formed as part of a gate stack structure. In addition, in some applications, such as in the fabrication of a flash memory film stack, a thin oxide layer may be formed surrounding the entire gate stack (referred to herein as pure oxidation), for example, via exposing the stack to an oxidation process. Such oxidation processes have conventionally been performed either thermally or using a plasma. In other applications, the oxide layer may be selectively formed only on certain layers of a film stack (referred to herein as selective oxidation).

Conventional thermal processes for forming oxide layers, for example, a gate oxide layer or a gate stack oxide layer, have worked relatively well in fabrication of semiconductor devices of the larger feature sizes used in the past. Unfortunately, as feature sizes are becoming much smaller and different oxides are employed in the next generation of advanced technologies, the high wafer temperatures required in thermal oxidation processes are problematic in that the sharp junction definitions which are now required become diffused at the higher temperatures (e.g., above about 700 degrees Celsius). Such a distortion of junction definitions and other features can lead to poor device performance or failure.

Plasma processes used to form oxide layers have similar problems. For example, at high chamber pressure (e.g., 100 mTorr), contaminants tend to accumulate in the gate oxide layer during formation, leading to fatal defects in the gate oxide structure such as dangling bonds or mobile charge, and at low chamber pressure (e.g., tens of mTorr), increased plasma ion energy leads to ion bombardment damage and other diffusion problems.

For example, conventional oxidation processes often result in a defect known as a bird's beak. Bird's beak refers to diffusion of the oxide layer into the layers of the film stack structure from the sides at the interface between adjacent layers, rounding off the corners of the adjacent layers. The resultant defect has a profile that resembles a bird's beak. The intrusion of the oxide layer into the active region of the memory cell (e.g., in flash memory applications) reduces the active width of the memory cell, thereby undesirably reducing the effective width of the cell and degrading the performance of the flash memory device.

In addition, in some film stack structures comprising both metal and non-metal containing layers, such as DRAM memory devices, sidewall oxidation of the non-metal containing layers may be desired as, in certain application, oxidation of the metal containing layers may limit electrical conductivity and reduce device function. For example, conventionally, selective sidewall oxidation in the presence of tungsten (W) metal may be achieved by using a mixture of hydrogen ($H_2$) and oxygen ($O_2$) gases which react in-situ at high pressures to produce oxidizing species or by using a mixture of water vapor ($H_2O$) and hydrogen ($H_2$). However, these conventional methods are not sufficient to achieve selective sidewall oxidation conditions in the presence of certain metal alloys, such as titanium nitride (TiN), as the process will undesirably oxidize the TiN.

Thus, there is a need for improved methods for oxidizing stacks of materials.

SUMMARY

Methods of fabricating an oxide layer on a semiconductor substrate are provided herein. The oxide layer may be formed over an entire structure disposed on the substrate, or selectively formed on a non-metal containing layer with little or no oxidation of an exposed metal-containing layer. The methods disclosed herein may be performed at temperatures below about 700 degrees Celsius. The methods disclosed herein may be performed in a variety of process chambers, including but not limited to decoupled plasma oxidation chambers, rapid and/or remote plasma oxidation chambers, and/or plasma immersion ion implantation chambers.

In some embodiments, a method of forming an oxide layer on a semiconductor substrate includes providing a substrate to be oxidized on a substrate support in a process chamber; and forming a plasma in the process chamber from a process gas to form an oxide layer on the substrate, the process gas comprising a hydrogen-containing gas, an oxygen-containing gas, and at least one of a nitridizing gas (e.g., a nitrogen-containing gas) or a supplemental oxidizing gas (e.g., a supplemental oxygen-containing gas).

The hydrogen-containing gas may include at least one of hydrogen ($H_2$) or water vapor ($H_2O$), the oxidizing gas may include at least one of oxygen ($O_2$) or water vapor ($H_2O$), the nitridizing gas may include at least one of ammonia ($NH_3$), nitric oxide (NO), or nitrous oxide ($N_2O$), and the supplemental oxidizing gas may include at least one of ozone ($O_3$) and hydrogen peroxide ($H_2O_2$).

In some embodiments, a method of forming an oxide layer on a semiconductor substrate includes providing a substrate to be oxidized on a substrate support in a process chamber; and forming a plasma in the process chamber from a process gas to form an oxide layer on the substrate, the process gas comprising ammonia ($NH_3$) and an oxygen-containing gas. The oxygen-containing gas may comprise at least one of oxygen ($O_2$), ozone ($O_3$), nitric oxide (NO), or nitrous oxide ($N_2O$). A supplemental hydrogen-containing gas comprising hydrogen ($H_2$) may also be provided.

In some embodiments, a method of forming an oxide layer on a semiconductor substrate includes providing a substrate to be oxidized on a substrate support in a process chamber; forming a plasma in the process chamber from a first process gas, the first process gas comprising a nitridizing gas; and forming a plasma in the process chamber from a second process gas to form an oxide layer on the substrate, the second process gas comprising a hydrogen-containing gas and an oxygen-containing gas. The nitridizing gas may comprise at least one of ammonia ($NH_3$), nitric oxide (NO), or nitrous oxide ($N_2O$). The hydrogen-containing gas may include at least one of hydrogen ($H_2$) or water vapor ($H_2O$). The oxygen-containing gas may include at least one of oxygen ($O_2$) or water vapor ($H_2O$).

In some embodiments, a pure oxidation process may be performed by providing the hydrogen-containing gas, or ammonia in an amount of up to about 60 percent, or up to about 75 percent of the total process gas provided. In some embodiments, a selective oxidation process may be performed by providing the hydrogen-containing gas, or ammonia in an amount of at least 75 percent of the total process gas provided.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
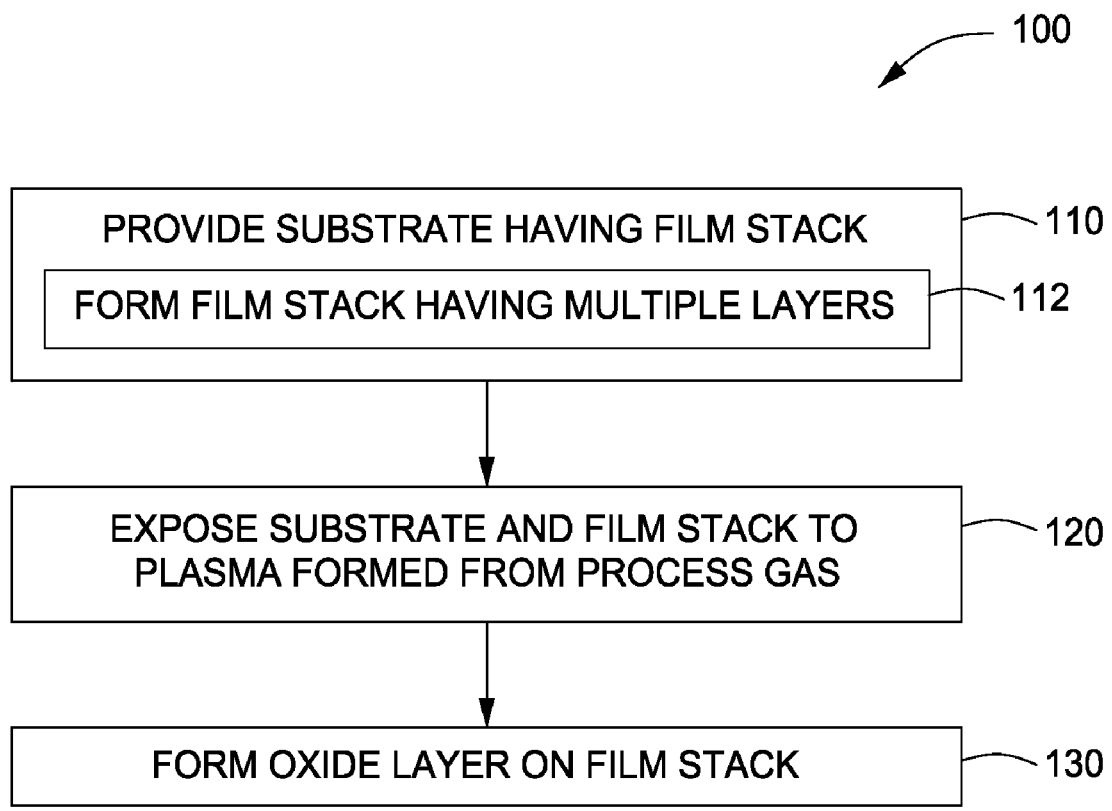
FIG. 1 depicts a flow chart of an oxidation process in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide methods for oxidation of semiconductor structures. The inventive processes advantageously provide complete oxidation of a semiconductor structure (pure oxidation) or selective formation of the oxide layer on selected layers of a semiconductor structure without much, if any, oxidation on the non-desired layers (selective oxidation). Embodiments of the present invention may be carried out in various process chambers, such a decoupled plasma oxidation chambers, rapid and/or remote plasma oxidation chambers, plasma immersion ion implantation chambers, or the like.

FIG. 1 depicts an illustrative process 100 for forming an oxide layer on a semiconductor structure in accordance with some embodiments of the present invention. The process includes providing a semiconductor structure including a substrate having a film stack disposed thereon. The semiconductor structure may be a partially fabricated semiconductor device, such as, Logic, DRAM, Flash devices, or the like. The process 100 is illustratively described herein with respect to semiconductor structures depicted in FIGS. 2A-B and FIGS. 3A-B, and may be performed in any suitable plasma process chamber, for example, such as the process chambers depicted in FIGS. 4-6, described below.

Figure 2A:
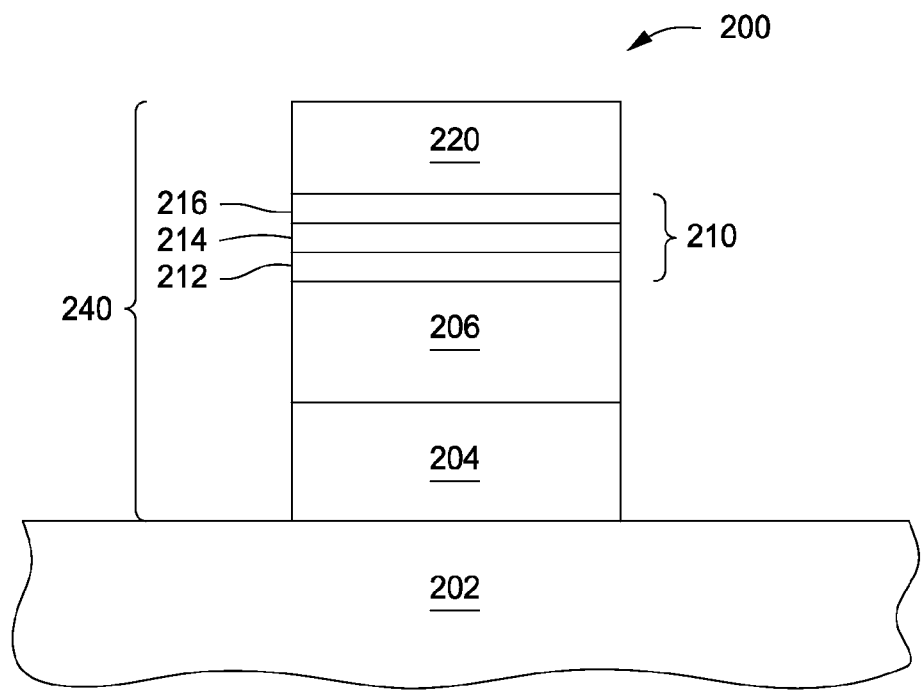
FIGS. 2A-B illustrate stages of fabrication of a semiconductor structure in accordance with some embodiments of the present invention.
Figure 2B:
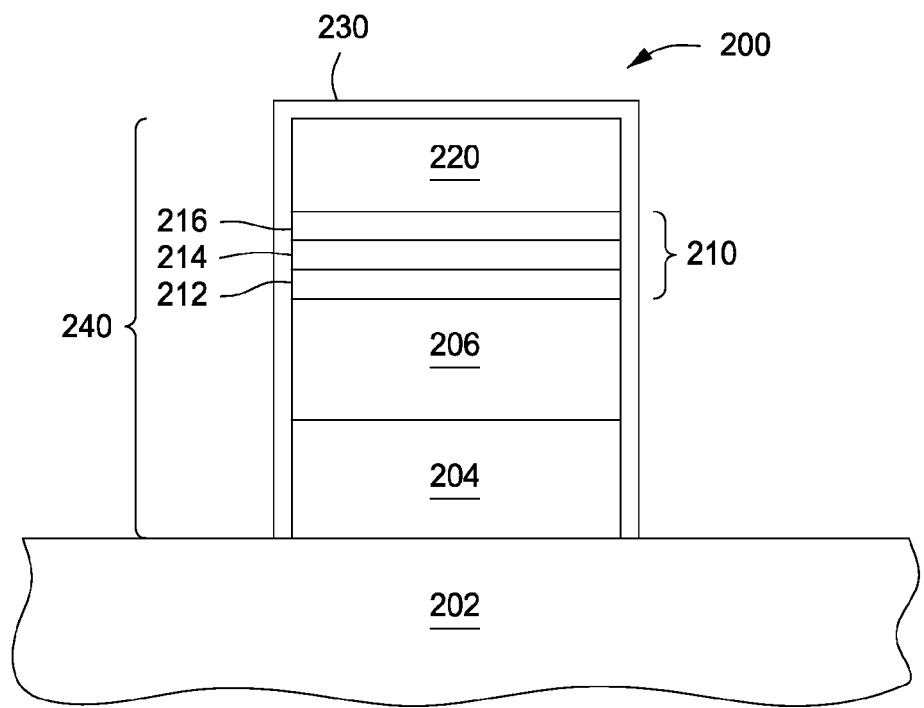

In some embodiments, the process 100 may provide for pure oxidation (e.g., oxidation of an entire structure or device on a substrate). For example, FIGS. 2A-B depict a partially formed semiconductor structure 200 including a substrate 202 having a film stack 240 formed thereon. The substrate 202 may have various dimensions, such as 200 or 300 mm diameter wafers, as well as rectangular or square panels, or other shapes and sizes. The substrate 202 may comprise a material such as crystalline silicon (e.g., Si<100> or Si<111>), silicon oxide, strained silicon, silicon germanium, doped or undoped polysilicon, doped or undoped silicon wafers, patterned or non-patterned wafers, silicon on insulator (SOI), carbon doped silicon oxides, silicon nitride, doped silicon, germanium, gallium arsenide, glass, sapphire, or the like.

The film stack 240 may be any stack of materials to be oxidized where pure oxidation is desired. For example, in some embodiments, such as in flash memory applications and as depicted in FIG. 2A, the film stack 240 may be a gate stack of a flash memory cell comprising a tunnel oxide layer 204, a floating gate layer 206, a single or multi-layer dielectric layer comprising the Interpoly Dielectric (IPD) 210 (a non-limiting example of the IPD is a multi-layer ONO layer comprising an oxide layer 212, a nitride layer 214, and an oxide layer 216 is illustratively shown in FIGS. 2A-B), and a control gate layer 220. The oxide layers 204, 212, 216 typically comprise silicon and oxygen such as silicon oxide ($SiO_2$), silicon oxynitride (SiON), or the like. The nitride layer 214 typically comprises silicon and nitrogen, such as silicon nitride (SiN), or the like. In some embodiments, a multi-layer comprising $SiO_2/Al_2O_3/SiO_2$ can also be used as the IPD layer 210. The floating gate layer 206 and the control gate layer 220 typically comprises a conductive material, such as polysilicon, metals, or the like.

As shown in FIG. 2B, an oxide layer 230 may be formed about the entire film stack 240 in a pure oxidation process as discussed in more detail below. It is contemplated that film stacks in other applications may be advantageously oxidized in accordance with the teachings provided herein, such as dynamic random access memory (DRAM) metal electrode/polysilicon gate stacks, Charge Trap Flash (CTF) for Non-volatile Memory (NVM), or the like. The DRAM metal electrode is typically tungsten (W) with interlayers of titanium nitride (TiN) or tungsten nitride (WN) between the tungsten and polysilicon layers. Charge Trap Flash (CTF) for Non-volatile Memory (NVM) uses a $SiO_2/SiN/Al_2O_3$ gate stack with a metal electrode of tantalum nitride (TaN) or titanium nitride (TiN) that may also benefit from sidewall oxidation after gate etch.

In addition to pure oxidation, in some embodiments, the process 100 may provide for selective oxidation (e.g., oxidation of portions of a structure or device on a substrate). Selective oxidation requirements may arise when oxidation processes need to be carried out in the presence of exposed metal or metal alloys. In such cases, the oxidation process needs to be carried out without abnormal oxidation of the exposed metal/metal alloy. The need for selective oxidation in the case of Logic, DRAM, Flash devices, or the like, typically arises during gate sidewall re-oxidation processes after a gate stack etch when metal gate electrodes are present, such as gate electrodes comprising titanium (Ti), titanium nitride (TiN), tungsten (W), tungsten silicide nitride (WSixN), tungsten nitride (WN), tantalum carbide (TaC), tantalum nitride (TaN), or the like.

Figure 3A:
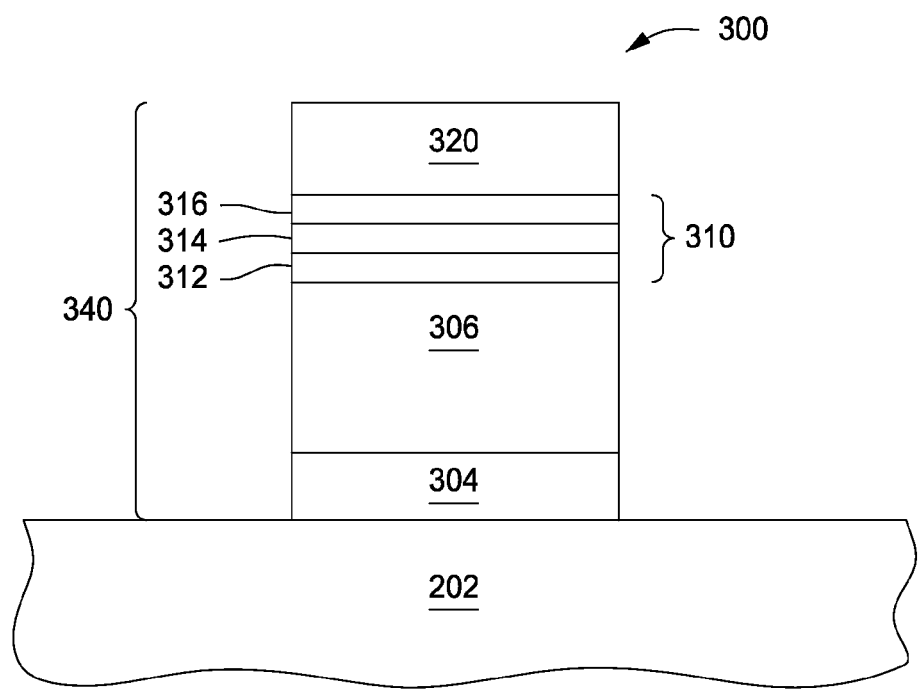
FIGS. 3A-B illustrate stages of fabrication of a semiconductor structure in accordance with some embodiments of the present invention.
Figure 3B:
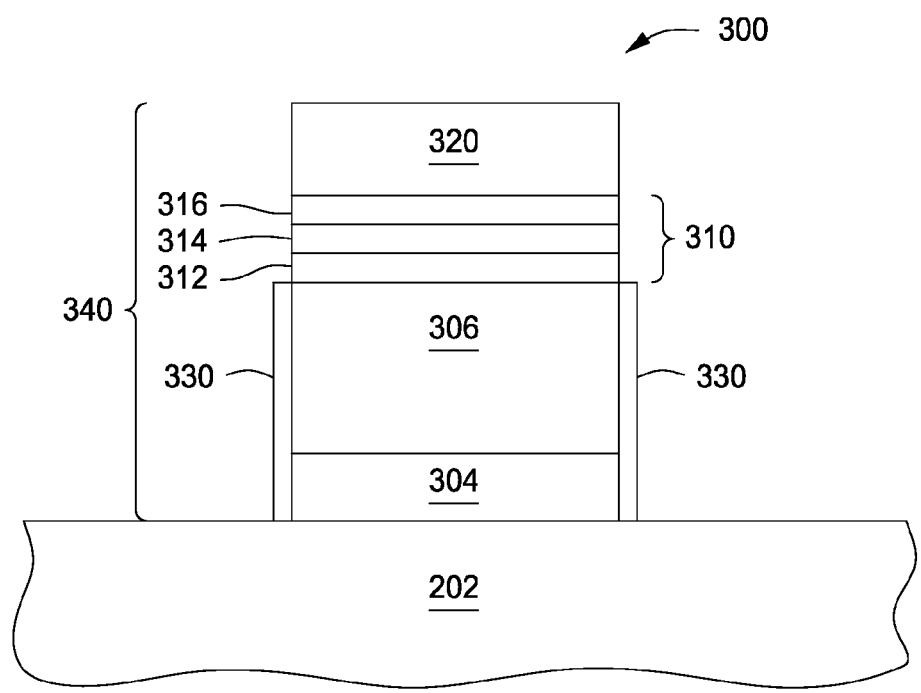

For example, FIGS. 3A-B depict a partially formed semiconductor structure 300 including a substrate 202 having a film stack 340 formed thereon. In some embodiments, the stack 340 includes a tunnel oxide layer 304, a floating gate layer 306, one or more electrically conductive barrier layers 312, 314, at least one metal layer 316 and a capping layer 320. The electrically conductive barrier layers 312, 314, and the metal layer 316 form a metal electrode 310. The one or more electrically conductive barrier layers may include titanium nitride (TiN), tungsten silicon nitride ($WSi_xN$), tungsten nitride (WN), tantalum carbide (TaC), and tantalum nitride (TaN). The at least one metal layer may include titanium (Ti) and tungsten (W). In some embodiments, the electrically conductive barrier layers 312, 314 are TiN and WN, respectively. In some embodiments, the metal layer is tungsten (W). The floating gate layer 206 comprises a conductive material, such as polysilicon (Si). The capping layer 320 may comprise an insulating material, such as silicon nitride (SiN).

As shown in FIG. 3B, an oxide layer 330 may be selectively formed about the non-metal containing layers (e.g., tunnel oxide layer 304 and floating gate layer 306) while not being formed about the metal-containing layers (e.g., layers 312, 314, 316 comprising metal electrode 310) in a selective oxidation process as discussed in more detail below. It is contemplated that film stacks in other applications comprising both metal-containing layers and non metal-containing layers may be advantageously selectively oxidized in accordance with the teachings provide herein.

Returning to FIG. 1, the process 100 begins at 110, where a substrate 202 is provided having a film stack to be oxidized disposed thereupon (e.g., film stack 240 shown in FIG. 2A, or film stack 340 shown in FIG. 3A). In some embodiments, the film stack (e.g., 240, 340) may be formed upon the substrate 202 at 112 and then provided to a suitable plasma process chamber for the oxidation process. For example, the film stack may be fabricated in one or more process chambers coupled to a cluster tool that also has a suitable oxidation process chamber coupled thereto. One example of a suitable cluster tool is a Gate Stack CENTURA®, available from Applied Materials, Inc., of Santa Clara, Calif.

Next, at 120, a process gas may be provided to a plasma process chamber. The process gas may be utilized for pure or selective oxidation as described in the embodiments herein, and may be utilized to form oxide layers (e.g., 230, 330) on the film stacks (e.g., 240, 340) as described above. In each of the following embodiments, the process gases, flow rates, ratios, and other process parameters may be utilized in any combination unless specifically indicated otherwise.

In some embodiments, and suitable for either pure or selective oxidation processes, the process gas may comprise a hydrogen-containing gas, an oxidizing gas, and at least one of a nitridizing gas (e.g., a nitrogen-containing gas) or a supplemental oxidizing gas (e.g., a supplemental oxygen-containing gas). The addition of the nitridizing gas or the supplemental oxidizing gas has been found to facilitate selectivity to metal-containing layers, thereby facilitating selective oxidation processes as described herein. The hydrogen-containing gas may include hydrogen ($H_2$) and/or water vapor ($H_2O$). The oxidizing gas may include oxygen ($O_2$) and/or water vapor ($H_2O$). The nitridizing gas may include ammonia ($NH_3$), nitric oxide (NO), nitrous oxide ($N_2O$), and combinations thereof. The supplemental oxidizing gas may include ozone ($O_3$) and hydrogen peroxide ($H_2O_2$), and combinations thereof. In the embodiments described herein, water vapor ($H_2O$) may be used as either the hydrogen-containing gas or the oxidizing gas, but not both.

In some embodiments, the process gas may include the hydrogen-containing gas, the oxidizing gas and the nitridizing gas. For example, in some embodiments, the process gas may include hydrogen ($H_2$), water vapor ($H_2O$), and at least one of ammonia ($NH_3$), nitric oxide (NO), or nitrous oxide ($N_2O$). In some embodiments, the process gas may include hydrogen ($H_2$), oxygen ($O_2$), and at least one of ammonia ($NH_3$), nitric oxide (NO), or nitrous oxide ($N_2O$). It has been discovered that the addition of a nitridizing gas facilitates selective oxidation of a non-metal containing layer in the presence of a metal-containing layer without oxidizing the metal-containing layer. For example, selective oxidation may be performed in the presence of a metal-containing layer that includes titanium nitride (TiN), tungsten silicide nitride ($WSi_xN$), tantalum nitride (TaN), tantalum carbide (TaC), or the like, without oxidizing the metal-containing layer.

In some embodiments, the process gas includes the hydrogen-containing gas, the oxidizing gas and the supplemental oxidizing gas. For example, in some embodiments, the process gas may include water vapor ($H_2O$), oxygen ($O_2$), and at least one of hydrogen peroxide ($H_2O_2$) or ozone ($O_3$). In some embodiments, the process gas may include hydrogen ($H_2$), oxygen ($O_2$), and at least one of hydrogen peroxide ($H_2O_2$) or ozone ($O_3$). It has been discovered that the addition of a supplemental oxidizing gas facilitates selective oxidation of a non-metal containing layer in the presence of a metal-containing layer without oxidizing the metal-containing layer. For example, selective oxidation may be performed in the presence of a metal-containing layer that includes titanium nitride (TiN), tungsten silicide nitride ($WSi_xN$), tantalum nitride (TaN), tantalum carbide (TaC), or the like, without oxidizing the metal-containing layer.

In some embodiments, a nitridation pretreatment may be performed in a first step prior to the introduction of a process gas comprising a hydrogen-containing gas and an oxygen-containing gas in a second step. The nitridation pretreatment includes introducing a nitridizing gas comprising at least one of the nitridizing gases discussed above. The hydrogen-containing gas and the oxygen-containing gas each may include any one or more of the gases discussed above. For example, in some embodiments, the nitridizing gas may include at least one of ammonia ($NH_3$), nitric oxide (NO), or nitrous oxide ($N_2O$), and the process gas may include hydrogen ($H_2$) and oxygen ($O_2$). In some embodiments, the nitridizing gas may include at least one of ammonia ($NH_3$), nitric oxide (NO), or nitrous oxide ($N_2O$), and the process gas may include hydrogen ($H_2$) and water vapor ($H_2O$).

In some embodiments, a process gas may be provided that includes a hydrogen-containing gas comprising at least ammonia ($NH_3$) and an oxygen-containing gas comprising at least one of oxygen ($O_2$), ozone ($O_3$), nitric oxide (NO), or nitrous oxide ($N_2O$)). The hydrogen-containing gas may additionally include hydrogen ($H_2$).

In some embodiments, the mixture of the process gas provided at 120 may be controlled to facilitate providing a pure or selective oxidation process. For example, in some embodiments, a pure oxidation process may be performed by providing the hydrogen-containing gas of any of the process gas combinations discussed above at up to about 75 percent, or in some embodiments up to about 60 percent, of the total amount of the process gas provided. In some embodiments, a selective oxidation process may be performed by providing the hydrogen-containing gas of any of the process gas combinations discussed above at at least about 50 percent, or in some embodiments at least about 75 percent of the total amount of process gas provided.

In some embodiments, the process gas (or gas mixture) may be provided at total flow rate of between about 100-2000 sccm, or at about 400 sccm. For example, in embodiments where both oxygen ($O_2$) and ammonia ($NH_3$) are provided, the oxygen ($O_2$) and ammonia ($NH_3$) may be provided in a total flow rate of between about 100-2000 sccm, or at about 400 sccm, in the percentage ranges described above. Accordingly, in embodiments where oxygen (O$_2$), ammonia (NH$_3$), and hydrogen (H$_2$) are provided, the process gases may be provided in the same total flow rate described above, and in the percentage ranges described above.

In some embodiments one or more inert carrier gases may also be provided. The inert gases may be provided as necessary to provide a total flow rate of between about 100-2000 sccm and to provide a process gas mixture having up to about 50 percent of the hydrogen-containing gas. Inert gas additions may also be used to prevent recombination of the ionized oxygen and/or hydrogen. Excited diatomic molecules typically like to recombine with themselves in a plasma, so the addition of inert gases (such as Ar, He, Kr, Ne, or the like) may facilitate higher oxidation rates.

TABLE I

| Process Gas Embodiment | Ratio (for pure or selective oxidation processes) | Total Gas Flow |
| --- | --- | --- |
| Nitridizing first step + second step utilizing H-containing gas + O-containing gas | Pure: up to 60% or up to 75% H-containing gas<br>Selective: 75% or higher H-containing gas | about 100-2000 sccm |
| H-containing gas + O-containing gas + Nitridizing gas | Pure: up to 60% or up to 75% H-containing gas<br>Selective: 75% or higher H-containing gas | about 100-2000 sccm |
| H-containing gas + O-containing gas + Supplemental oxidizing gas | Pure: up to 60% or up to 75% H-containing gas<br>Selective: 75% or higher H-containing gas | about 100-2000 sccm |
| Ammonia + O-containing gas | Pure: up to 60% or up to 75% ammonia<br>Selective: 75% or higher ammonia | about 100-2000 sccm |

Table I, above, summarizes the various embodiments of process gas combinations and process gas mixtures or ratios for performing pure or selective oxidation in accordance with embodiments of the present invention.

The oxide layer (e.g., 230, 330) may be formed to a thickness of between about 5-100 Angstroms. The process 100 may provide growth rates of oxide films between about 7-50 Angstroms per minute, or at least about 25 Angstroms per minute. The inventive process disclosed herein facilitates forming the oxide described above at a lower thermal budget, thereby limiting diffusion effects by reducing the exposure time of the substrate to the process as compared to conventional oxidation processes. In some embodiments, the process may have a duration of between about 5-300 seconds.

Upon forming the oxide layer (e.g., 230, 330) to a desired thickness over the film stack (e.g., 240, 340), the process 100 ends. The substrate 202 may be subsequently further processed as necessary to complete the structures being fabricated thereon.

Figure 4:
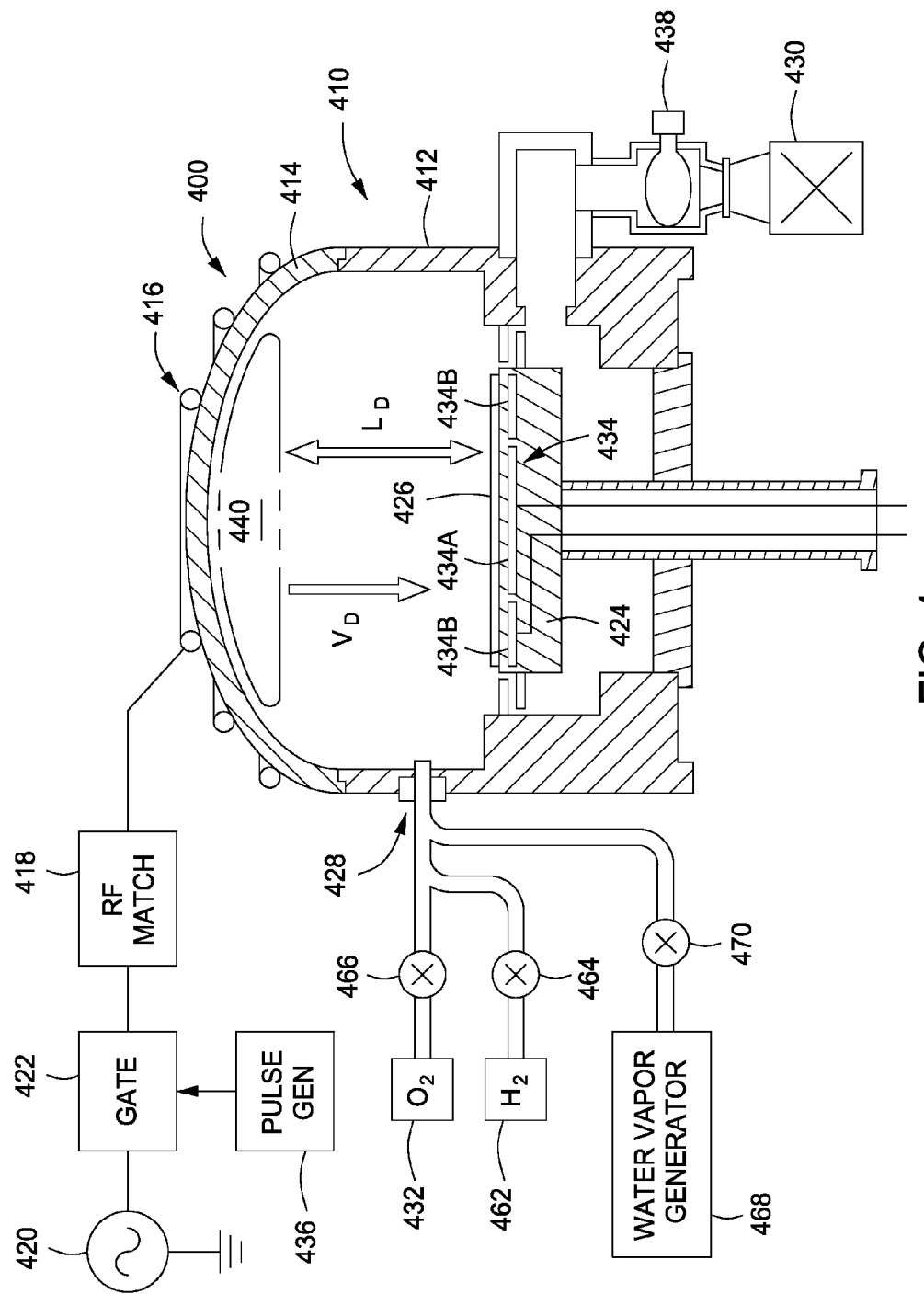
FIG. 4 illustrates a decoupled plasma oxidation reactor suitable for carrying out embodiments of the present invention.

Embodiments of the present invention may be carried out in suitably equipped plasma reactors, such as Decoupled Plasma Oxidation (DPO) reactors available from Applied Materials, Inc., of Santa Clara, Calif., or elsewhere, and described below with reference to FIG. 4. Other suitable plasma reactors may also be utilized including Remote Plasma Oxidation (RPO) reactors, or toroidal source plasma immersion ion implantation reactor, such as P3I available from Applied Materials, Inc. which are described below with reference to FIGS. 5-6, respectively. For example, FIG. 4 depicts an illustrative plasma reactor 400 suitable for carrying out oxide formation processes in accordance with embodiments of the present invention. The reactor 400 may provide a low ion energy plasma via an inductively coupled plasma source power applicator driven by a pulsed or continuous wave (CW) RF power generator. The reactor includes a chamber 410 having a cylindrical side wall 412 and a ceiling 414 which may be either dome-shaped (as shown in the drawing), flat, or other geometry. The plasma source power applicator comprises a coil antenna 416 disposed over the ceiling 414 and coupled through an impedance match network 418 to an RF power source consisting of an RF power generator 420 and a gate 422 at the output of the generator 420 controlled by a pulse signal having a selected duty cycle. The RF power generator 420 is configured to provide power between about 50 watts to about 2500 watts. It is contemplated that other low ion energy producing plasma source power applicators may be utilized as well, such as remote RF or microwave plasma sources.

The reactor 400 further includes a substrate support pedestal 424, such as an electrostatic chuck or other suitable substrate support, for holding a semiconductor substrate 426, for example a 200 or 300 mm semiconductor wafer or the like. The substrate support pedestal 424 typically includes a heating apparatus, such as a heater 434 beneath the top surface of the substrate support pedestal 424. The heater 434 may be a single or multiple zone heater, such as a dual radial zone heater having radially inner and outer heating elements 434a, 434b, as depicted in FIG. 4.

The reactor 400 further includes a gas injection system 428 and a vacuum pump 430 coupled to the interior of the chamber. The gas injection system 428 is supplied to one or more process gas sources, for example, an oxygen container 432, a hydrogen container 462, a water vapor container 468, or other process gas source as required for a particular application. Flow control valves 466, 464, 470 respectively coupled to the gas sources (e.g., the oxygen container 432, the hydrogen container 462, the water vapor container 468, and the like) may be utilized to selectively provide process gases or process gas mixtures to the interior of the chamber during processing. Other gas sources (not shown) for providing additional gases, such as inert gases (helium, argon, or the like), gaseous mixtures, or the like, may also be provided. The chamber pressure may be controlled by a throttle valve 438 of the vacuum pump 430.

The duty cycle of the pulsed RF power output at the gate 422 may be controlled by controlling the duty cycle of a pulse generator 436 whose output is coupled to the gate 422. Plasma is generated in an ion generation region 440 corresponding to a volume under the ceiling 414 surrounded by the coil antenna 416. As the plasma is formed in an upper region of the chamber 410 at a distance from the substrate 426, the plasma is referred to as a quasi-remote plasma (e.g., the plasma has benefits of remote plasma formation, but is formed within same process chamber 410 as the substrate 426.) Alternatively, a remote plasma may be utilized, in which case the ion generation region 440 may be disposed outside of the chamber 410.

In operation, the plasma reactor 400 may be employed to carry out oxidation processes in accordance with embodiments of the present invention to deposit high quality oxide layers having reduced defects, such as a very low defect density, reduced bird's beak, and the like. The defects may be reduced by reducing the duty cycle of the pulsed RF plasma. The processes may further be performed at a reduced temperature which limits diffusion, which is a significant advantage for minimizing bird's beak.

For example, a plasma may be generated at 130 from the process gases within the plasma process chamber 400 to form an oxide layer (completely or selectively) over the film stack (e.g., 240, 340). The plasma is formed in the ion generation region 440 of the chamber 410 via inductive coupling of RF energy from the coil antenna 416 disposed over the ceiling 414, thereby advantageously providing a low ion energy (e.g., less than about 5 eV for pulsed plasmas and less than 15 eV for CW plasmas). The low ion energy of the plasma limits ion bombardment damage and facilitates oxidation of the sidewalls of the stack while limiting diffusion of oxygen between the layers thereof, thereby reducing bird's beak.

In some embodiments, about 25 to 5000 watts of power may be provided to the coil antenna 116 at a suitable frequency to form a plasma (for example, in the MHz or GHz range, or about 13.56 MHz or greater). The power may be provided in a continuous wave or pulsed mode with duty cycles of between about 2 to 70 percent.

For example, in some embodiments, the plasma may be generated during successive "on" times, and ion energy of the plasma allowed to decay during successive "off" intervals. The "off" intervals separate successive "on" intervals and the "on" and "off" intervals define a controllable duty cycle. The duty cycle limits kinetic ion energy at the surface of the substrate below a pre-determined threshold energy. In some embodiments, the pre-determined threshold energy is at or below about 5 eV.

For example, during the "on" time of the pulsed RF power, the plasma energy increases and during the "off" time it decreases. During the short "on" time, the plasma is generated in the ion generation region 440 loosely corresponding to the volume enclosed by the coil antenna 416. The ion generation region 140 is elevated a significant distance $L_D$ above the substrate 426. Plasma generated in the ion generation region 440 near the ceiling 414 during the "on" time drifts at an average velocity $V_D$ toward the substrate 426 during the "off" time. During each "off" time, the fastest electrons diffuse to the chamber walls, allowing the plasma to cool. The most energetic electrons diffuse to the chamber walls at a much faster velocity than the plasma ion drift velocity $V_D$. Therefore, during the "off" time, the plasma ion energy decreases significantly before the ions reach the substrate 426. During the next "on" time, more plasma is produced in the ion generation region 440, and the entire cycle repeats itself. As a result, the energy of the plasma ions reaching the substrate 426 is significantly reduced. At the lower range of chamber pressure, namely around 10 mT and below, the plasma energy of the pulsed RF case is greatly reduced from that of the continuous RF case.

The "off" time of the pulsed RF power waveform and the distance $L_D$ between the ion generation region 440 and the substrate 426 must both be sufficient to allow plasma generated in the ion generation region 440 to lose a sufficient amount of its energy so that it causes little or no ion bombardment damage or defects upon reaching the substrate 426. Specifically, the "off" time is defined by a pulse frequency between about 2 and 30 kHz, or at about 10 kHz, and an "on" duty cycle between about 5% and 20%. Thus, in some embodiments, the "on" interval may last between about 5-50 microseconds, or about 20 microseconds and the "off" interval may last between about 50-95 microseconds, or about 80 microseconds.

In some embodiments, the ion generation region-to-substrate distance $L_D$ is greater than about 2 cm, or between about 2-20 cm. The ion generation region-to-substrate distance $L_D$ can be about the same as (or greater than) the distance $V_D$ times the "off" time traveled by the plasma ions during a single "off" time of the pulsed RF power waveform.

In both the continuous wave and the pulsed mode, the plasma generated at 330 advantageously balances the cogeneration of oxygen and hydrogen ions within the chamber and close enough to the substrate to limit the loss of reactivity of the ions with control of the ion energy to prevent ion bombardment induced damage or diffusion damage (e.g., bird's beak).

The plasma generated at 130 (as discussed above with respect to FIG. 1) may be formed in a low pressure process, thereby reducing the likelihood of contamination induced defects. For example, in some embodiments, the chamber 410 may be maintained at a pressure of between about 1-500 mTorr. Moreover, ion bombardment-induced defects that would be expected at such a low chamber pressure levels may be limited or prevented by using the quasi-remote plasma source and, optionally, by pulsing the plasma source power as described above.

The substrate may be maintained at about room temperature (about 22 degrees Celsius), or at a temperature of between about 20-750 degrees Celsius, or less than about 700 degrees Celsius, or less than about 600 degrees Celsius. The low temperature of the process reduces the ion energy of the plasma constituents, thereby further limiting diffusion of oxygen between the layers of the stack 200 and, thereby further reducing bird's beak. In some embodiments, higher temperatures may be utilized as well, such as less than about 800 degrees Celsius in remote plasma oxidation processes.

As discussed above, embodiments of the present invention may be performed in different chambers than the decoupled plasma oxidation chamber described above. Two additional exemplary plasma reactors suitable for performing the invention process include a rapid and/or remote plasma oxidation (RPO) reactor, illustrated in FIG. 5, and a toroidal source plasma immersion ion implantation reactor, such as P3I, illustrated in FIG. 6. Each of these reactors are available from Applied Materials, Inc. of Santa Clara, Calif.

Figure 5:
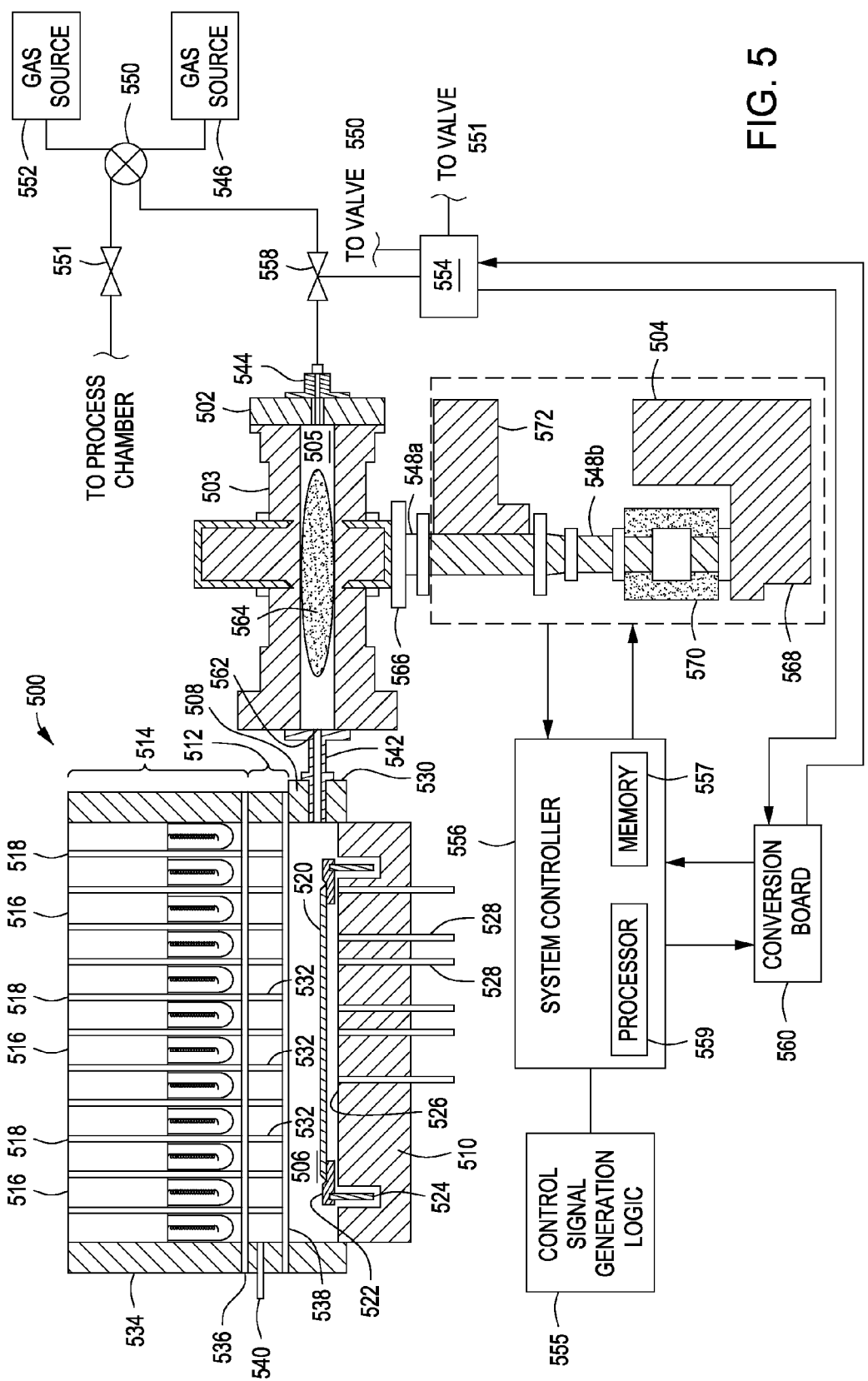
FIG. 5 illustrates a rapid plasma oxidation reactor suitable for carrying out embodiments of the present invention.

FIG. 5 illustrates one embodiment of an apparatus or system used to form a plasma from process gases, and utilized to deposit an oxide layer on a semiconductor structure, such as 200 and 300 illustrated in FIGS. 2A-B and 3A-B, respectively. The apparatus or system includes a rapid thermal processing (RTP) apparatus 500, such as, but not limited to, the Applied Materials, Inc., RTP CENTURA® with a HONEYCOMB SOURCE™. Such a suitable RTP apparatus and its method of operation are set forth in U.S. Pat. No. 5,155,336, assigned to the assignee of the invention, and which is incorporated herein by reference. Other types of thermal reactors may be substituted for the RTP apparatus such as, for example, the Epi or Poly Centura® Single Wafer "Cold Wall" Reactor by Applied Materials used to form high temperature films, such as epitaxial silicon, polysilicon, oxides, and nitrides. The DxZ® chamber by Applied Materials is also suitable.

Coupled to RTP apparatus 500 is a plasma applicator 502 that, in operation, provides radicals of a plasma to RTP apparatus 500. Coupled to plasma applicator 502 is an energy source 504 to generate an excitation energy to create a plasma.

In the embodiment illustrated in FIG. 5, the RTP apparatus 500 includes a process chamber 506 enclosed by a side wall 508 and a bottom wall 510. The upper portion of side wall 508 of chamber 506 is sealed to a window assembly 512 by "O" rings. A radiant energy light pipe assembly or illuminator 514 is positioned over and coupled to window assembly 512. Light pipe assembly 514 includes a plurality of tungsten halogen lamps 516, for example, Sylvania EYT lamps, each mounted into, for example, light pipes 518 that can be made of stainless steel, brass, aluminum, or other metals.

A wafer or substrate 520 is supported on an edge inside chamber 506 by a support ring 522 typically made of silicon carbide. Support ring 522 is mounted on a rotatable quartz cylinder 524. By rotating quartz cylinder 524, support ring 522 and wafer or substrate 520 are caused to rotate during processing. An additional silicon carbide adapter ring can be used to allow wafers or substrates of different diameters to be processed (e.g., 150 millimeter, 200 millimeter or 300 millimeter wafers).

Bottom wall 510 of RTP apparatus 520 includes, for example, a gold-coated top surface or reflector 526 for reflecting energy onto the backside of wafer or substrate 520. Additionally, RTP apparatus 500 includes a plurality of fiber optic probes 528 positioned through bottom wall 510 of RTP apparatus 500 to detect the temperature of wafer or substrate 520 at a plurality of locations across its bottom surface.

RTP apparatus 520 includes a gas inlet (not shown) formed through side wall 508 for injecting a process gas into chamber 506 to allow various processing steps to be carried out in chamber 506. Positioned on the opposite side of gas inlet, in side wall 508, is a gas outlet (not shown). The gas outlet is part of an exhaust system and is coupled to a vacuum source, such as a pump (not shown), to exhaust process gas from chamber 506 and to reduce the pressure in chamber 506. The exhaust system maintains the desired pressure while process gas, including radicals of a plasma, is continually fed into chamber 506 during processing.

Another gas inlet 530 is formed through side wall 508 through which a plasma of a process gas may be injected into the process chamber. Coupled to gas inlet 530 is applicator 502 to inject radicals of the plasma into the process chamber.

Light pipe assembly 514 may include lamps 516 positioned in a hexagonal array or in a "honeycomb" shape. Lamps 516 are positioned to adequately cover the entire surface area of wafer or substrate 520 and support ring 522. Lamps 516 are grouped in zones that can be independently controlled to provide for extremely uniform heating of wafer or substrate 520. Light pipes 518 can be cooled by flowing a coolant, such as water, between the various light pipes.

Window assembly 512 includes a plurality of short light pipes 241. A coolant, such as water, can be injected into the space between light pipes 532 to cool light pipes 532. Light pipes 532 register with light pipes 518 of the illuminator. A vacuum can be produced in the plurality of light pipes 532 by pumping through a tube 540 connected to one of the light pipes 532 which is in turn connected to the rest of the pipes.

RTP apparatus 500 is a single wafer reaction chamber capable of ramping the temperature of wafer or substrate 520 at a rate of 25-100 degrees Celsius/second. RTP apparatus 500 is said to be a "cold wall" reaction chamber because the temperature of wafer or substrate 520 during, for example, an oxidation process is at least 400 degrees Celsius greater than the temperature of chamber side wall 508. Heating/cooling fluid can be circulated through side walls 508 and/or bottom wall 510 to maintain the walls at a desired temperature.

As noted above, plasma applicator 502 is coupled to RTP apparatus 500 to provide a source of radicals of a plasma to RTP apparatus 500. In one embodiment, plasma is connected to RTP apparatus 500 by an inlet member 542. Plasma applicator 502 also includes a gas inlet 544. Coupled to gas inlet 544 is a gas source, such as a reservoir or tank 546. Plasma applicator 502 is coupled to energy source 504 by waveguides 548a and 548b.

FIG. 5 illustrates an embodiment wherein plasma applicator 502 is remote from RTP apparatus 500 in that the plasma is generated outside chamber 506 of RTP apparatus 500. By locating plasma applicator 502 remotely from chamber 506 of RTP apparatus 500, a plasma source can be selectively generated to limit the composition of the plasma exposed to wafer or substrate 520 to predominantly radicals. Thus, a plasma of ions, radicals, and electrons is generated in plasma applicator 502. However, because of the size (e.g., length and volume) of plasma applicator 502 or the combined size of plasma applicator 502 and inlet member 542, all or the majority of ions generated by the excitation of the process gas to form a plasma outlive their ionic lifetime and become charge neutral. Thus, the composition of the plasma that is supplied to the gas inlet of RTP apparatus 500 is predominantly radicals.

Plasma applicator 502 includes a body 503 of, for example, aluminum or stainless. Body 503 surrounds a tube 505. The tube 505 is, for example, made of quartz or sapphire. The tube 505 preferably does not have any electrical bias present that might attract charged particles, e.g., ions. One end of body 503 includes gas inlet 544.

Coupled to gas inlet 544 is gas source 546. The gas source 546 is coupled to gas inlet 544 through a first input of a three-way valve 550. A second input of three-way valve 550 is coupled to another process gas source, such as a reservoir or tank 552. In a first position, valve 550 provides for gas flow between gas source 546 and gas inlet 544, while preventing any gas flow from gas source 552 to process chamber 506. The valve 550, in a second position, provides for gas flow between gas source 552 and process chamber 506, while preventing gas flow from gas source 546 to gas inlet 544 of the applicator.

A flow controller 554 is connected to valve 550 to switch the valve between its different positions, depending upon which process is to be carried out. The flow controller can function as a mass flow controller and be coupled between source gas 546 and gas inlet 544 to regulate the flow of gas to plasma applicator 502. The flow controller 554 also functions in a similar fashion to control valves 550 and 551 to provide an appropriate process gas flow from gas source 315 to the process chamber.

Positioned on the opposite side of gas inlet 544 is a radicals outlet 562. Radicals outlet 562 is coupled to inlet member 542 to supply, in one embodiment, radicals of a plasma 564 to chamber 506 of RTP apparatus 500. Radicals outlet 562 typically has a diameter larger than gas inlet 544 to allow the excited radicals to be efficiently discharged at the desired flow rate and to minimize the contact between the radicals and tube 505. The flow rate of the radicals generated and discharged by plasma applicator 502 is determined primarily by the source gas inlet flow, the dimensions of tube 505 and radical outlet 562, and the pressure in plasma applicator 502.

The pressure in the process chamber should be less than the pressure in the applicator. The pressure in the process chamber may be between about 0.50 and 4.0 Torr, while the pressure in the applicator may be between about 1.0 and 8.0 Torr. For example, if the pressure in the applicator is about 2.00 Torr, then the pressure in the process chamber should be about 1.00 Torr.

At a position between gas inlet 544 and radicals outlet 562 of body 503 is energy source inlet 566. Energy source inlet 566 allows the introduction into tube 505 of excitation energy, such as an energy having a microwave frequency, from energy source 504. In the case of a microwave frequency, the excitation energy moves into body 503 of plasma applicator 502 and through tube 505 to excite the gas source traveling in a direction perpendicular to energy source inlet 564 into a plasma.

An applicator which may be used in the system and method of the invention is available from Applied Komatsu Technology, Inc., Sunnyvale, Calif.

In one embodiment, energy source 504 consists of a magnetron 568, and an isolator and dummy load 570, which is provided for impedance matching. Magnetron 568 generates an excitation energy, such as for example, an electromagnetic or inductively coupled frequency. The magnetron can generate between 1.5 and 6.0 kilowatts of 2.54 GHZ of microwave energy. A suitable magnetron assembly can be obtained from Applied Sciences and Technology, Woburn, Mass., or Daihen America, Santa Clara, Calif.

The excitation energy from magnetron 568 is directed through isolator and dummy load 570, and waveguides 548a and 548b to tube 505. Dummy load 570 acts, in one sense, like a check valve to allow energy flow in a direction toward applicator 502 but not toward magnetron 568.

Between plasma applicator 502 and waveguide 548b is autotuner 572. The autotuner redirects radiation reflected from applicator 502 back toward the plasma applicator to increase the energy supplied to plasma applicator 502. Autotuner 572 also focuses the microwave energy into the center of tube 505 so that the energy is more preferentially absorbed by the gas fed to the applicator. Although an autotuner is preferred, a manual tuner may be used.

A control signal generation logic 555 is supplied to system controller 556 in the form of, for example, software instruction logic that is a computer program stored in a computer-readable medium such as a memory 557 in system controller 556. The computer program includes, among other things, sets of instructions that dictate the timing, gas flow rate, chamber pressure, chamber temperature, RF power level, energy source regulation and other parameters of a particular process. The computer program is processed by system controller 556 in a processor 559.

Figure 6:
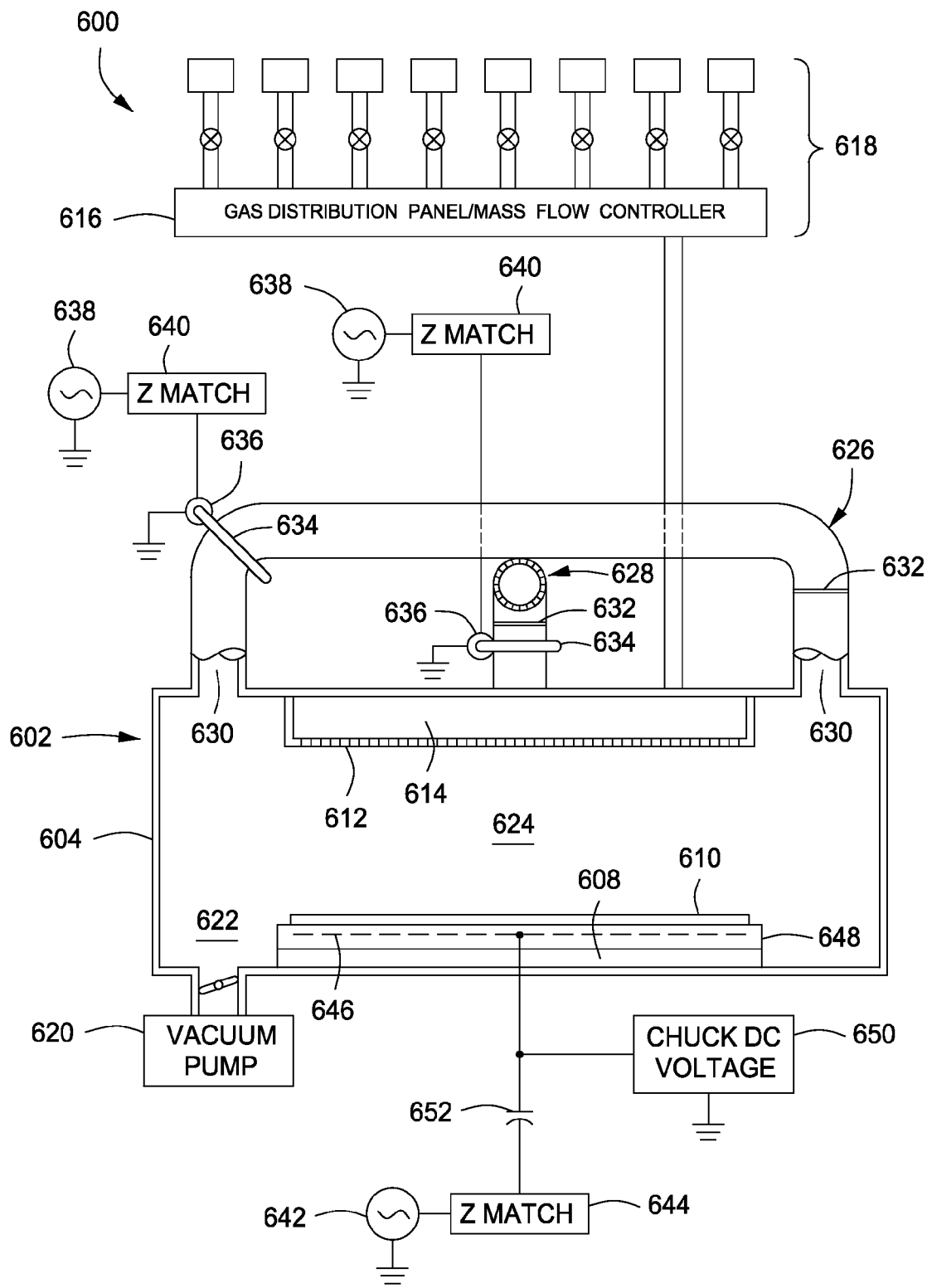
FIG. 6 illustrates a plasma immersion ion implantation reactor suitable for carrying out embodiments of the present invention.

FIG. 6 illustrate one embodiment of toroidal source plasma ion immersion implantation reactor such as, but not limited to, the Applied Materials, Inc., P3I reactor . Such a suitable reactor and its method of operation are set forth in U.S. Pat. No. 7,166,524, assigned to the assignee of the invention, and which is incorporated herein by reference.

Referring to FIG. 6, a toroidal source plasma immersion ion implantation ("P3I") reactor 600 may include a cylindrical vacuum chamber 602 defined by a cylindrical side wall 604 and a disk-shaped ceiling 606. A wafer support pedestal 608 at the floor of the chamber supports a semi-conductor wafer 610 to be processed. A gas distribution plate or showerhead 612 on the ceiling 606 receives process gas in its gas manifold 614 from a gas distribution panel 616 whose gas output can be any one of or mixtures of gases from one or more individual gas supplies 618. A vacuum pump 620 is coupled to a pumping annulus 622 defined between the wafer support pedestal 608 and the sidewall 604. A process region 624 is defined between the wafer 610 and the gas distribution plate 612.

A pair of external reentrant conduits 626, 628 establish reentrant toroidal paths for plasma currents passing through the process region, the toroidal paths intersecting in the process region 624. Each of the conduits 626, 628 has a pair of ends 630 coupled to opposite sides of the chamber. Each conduit 626, 628 is a hollow conductive tube. Each conduit 626, 628 has a D.C. insulation ring 632 preventing the formation of a closed loop conductive path between the two ends of the conduit.

An annular portion of each conduit 626, 628, is surrounded by an annular magnetic core 634. An excitation coil 636 surrounding the core 634 is coupled to an RF power source 638 through an impedance match device 640. The two RF power sources 638 coupled to respective ones of the cores 636 may be of two slightly different frequencies. The RF power coupled from the RF power generators 638 produces plasma ion currents in closed toroidal paths extending through the respective conduit 626, 628 and through the process region 624. These ion currents oscillate at the frequency of the respective RF power source 626, 628. Bias power is applied to the wafer support pedestal 608 by a bias power generator 642 through an impedance match circuit 644.

Plasma formation and subsequent oxide layer formation may be performed by introducing the process gases into the chamber 624 through the gas distribution plate 612 and applying sufficient source power from the generators 638 to the reentrant conduits 626, 628 to create toroidal plasma currents in the conduits and in the process region 624. The plasma flux proximate the wafer surface is determined by the wafer bias voltage applied by the RF bias power generator 642. The plasma rate or flux (number of ions sampling the wafer surface per square cm per second) is determined by the plasma density, which is controlled by the level of RF power applied by the RF source power generators 638. The cumulative ion dose (ions/square cm) at the wafer 610 is determined by both the flux and the total time over which the flux is maintained.

If the wafer support pedestal 608 is an electrostatic chuck, then a buried electrode 646 is provided within an insulating plate 648 of the wafer support pedestal, and the buried electrode 646 is coupled to the bias power generator 642 through the impedance match circuit 644.

In operation, the formation of an oxide layer on a semiconductor wafer is achieved by placing the wafer 610 on the wafer support pedestal 608, introducing one or more process gases into the chamber 602 and striking a plasma from the process gases. The wafer bias voltage delivered by the RF bias power generator 642 can be adjusted to control the flux of ions to the wafer surface.

Thus, embodiments of processes for forming an oxide layer on a substrate, or on a film stack disposed thereon, have been provided herein. The processes advantageously provide for total oxidation of a film stack or for selective formation of the oxide layer on non metal-containing layers of a film stack.

While the foregoing is directed to embodiments of the present invention, other and further embodiments of the invention may be devised without departing from the basic scope thereof.

We claim:

1. A method of forming an oxide layer on a substrate, comprising:
   providing a substrate comprising a metal-containing layer and non-metal containing layer;
   exposing the substrate to a first plasma formed from a first process gas comprising a nitrogen-containing gas; and
   subsequently exposing the substrate to a second plasma formed from a second process gas comprising a hydrogen-containing gas and an oxygen-containing gas to form an oxide layer on an exposed surface of the non-metal containing layer.

2. The method of claim 1, wherein forming an oxide layer further comprises:
   oxidizing an exposed surface of the metal containing layer.

3. The method of claim 1, wherein the metal-containing layer comprises at least one of tungsten (W), titanium (Ti), titanium nitride (TiN), tungsten silicon nitride (WSi$_x$N), tungsten nitride (WN), tantalum carbide (TaC), and tantalum nitride (TaN).

4. The method of claim 1, wherein the non-metal containing layer comprises at least one of as silicon oxide ($SiO_2$), silicon oxynitride (SiON), or polysilicon (poly-Si).

5. The method of claim 1, wherein the hydrogen-containing gas comprises at least one of hydrogen ($H_2$) or water ($H_2O$).

6. The method of claim 1, wherein the oxygen-containing gas comprises at least one of oxygen ($O_2$) or water ($H_2O$).

7. The method of claim 1, wherein forming an oxide layer further comprises:
selectively oxidizing the exposed surface of the non-metal containing layer by exposure to the second plasma.

8. The method of claim 1, wherein the first process gas comprises at least one of ammonia ($NH_3$), nitric oxide (NO), or nitrous oxide ($N_2O$).

9. The method of claim 1, wherein the hydrogen-containing gas comprises at least one of hydrogen ($H_2$) or water ($H_2O$), and the oxygen-containing gas comprises at least one of oxygen ($O_2$) or water ($H_2O$), and wherein water ($H_2O$) is not both of the hydrogen-containing gas and the oxygen-containing gas.

10. The method of claim 1, wherein subsequently exposing the substrate to the second plasma to form the oxide layer further comprises:
selectively oxidizing the exposed surface of the non-metal containing layer.

11. The method of claim 1, wherein the second process gas comprises up to about 60% hydrogen containing gas.

12. The method of claim 1, wherein the second process gas comprises up to about 75% hydrogen containing gas.

13. The method of claim 1, wherein the second process gas comprises at least about 50% hydrogen containing gas.

14. The method of claim 1, wherein the second process gas comprises at least about 75% hydrogen containing gas.

15. The method of claim 1, wherein the second process gas is provided at a total flow rate of about 100 to about 2000 sccm.

16. The method of claim 1, wherein the duration of the process is about 5 to about 300 seconds.

17. The method of claim 1, wherein the oxide layer is formed to a thickness of about 5 to about 100 angstroms.

18. The method of claim 15, wherein the second process gas further comprises an inert gas in sufficient quantity to provide a total flow rate of about 100 to about 2000 sccm.

* * * * *